United States Patent
Nakano

[11] Patent Number: 6,157,202
[45] Date of Patent: Dec. 5, 2000

[54] HYBRID IC WITH CIRCUIT FOR BURN-IN TEST

[75] Inventor: Toshiya Nakano, Tokyo, Japan

[73] Assignee: Mitsubishi Denki Kabushiki Kaisha, Tokyo, Japan

[21] Appl. No.: 09/100,245

[22] Filed: Jun. 19, 1998

[30] Foreign Application Priority Data

Jan. 16, 1998 [JP] Japan ................... 10-006478

[51] Int. Cl.[7] .................................................. G01R 31/02
[52] U.S. Cl. ....................................... 324/760; 324/158.1
[58] Field of Search .................................... 324/760, 765, 324/158.1, 73.1; 438/14, 17, 18; 257/40, 48

[56] References Cited

U.S. PATENT DOCUMENTS 5,393,991  2/1995  Kawakami ................................ 257/48

FOREIGN PATENT DOCUMENTS 59-186330  10/1984  Japan.

*Primary Examiner*—Vinh P. Nguyen
*Attorney, Agent, or Firm*—Oblon, Spivak, McClelland, Maier & Neustadt, P.C.

[57] ABSTRACT

A hybrid IC with a semiconductor power device and a control circuit for controlling the power device being bare-chip mounted on a substrate includes a wiring arranged between a power source line and a gate of the power device whereby the wiring connects the power source line to the gate during a burn-in test and is cut off after the burn-in test. The hybrid IC preferably provides a wiring pattern for disconnecting the control circuit to the gate of the power device during a burn-in test which is shortcircuited after the burn-in test.

6 Claims, 3 Drawing Sheets

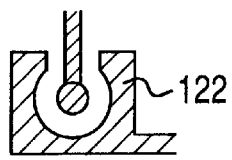
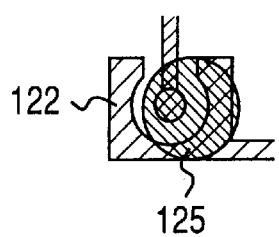
Fig.5A  Fig.5B
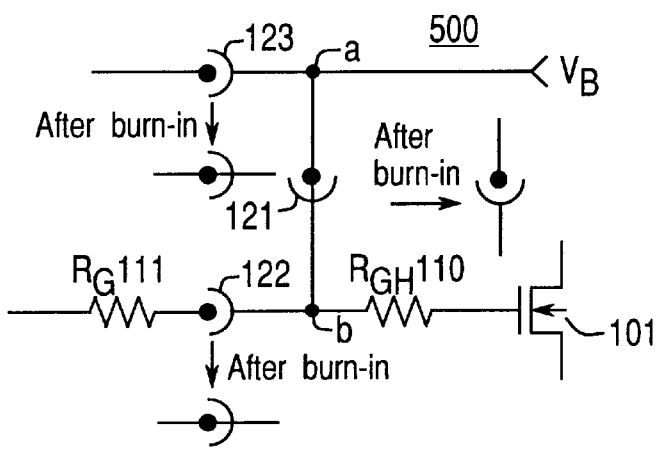
Fig.6
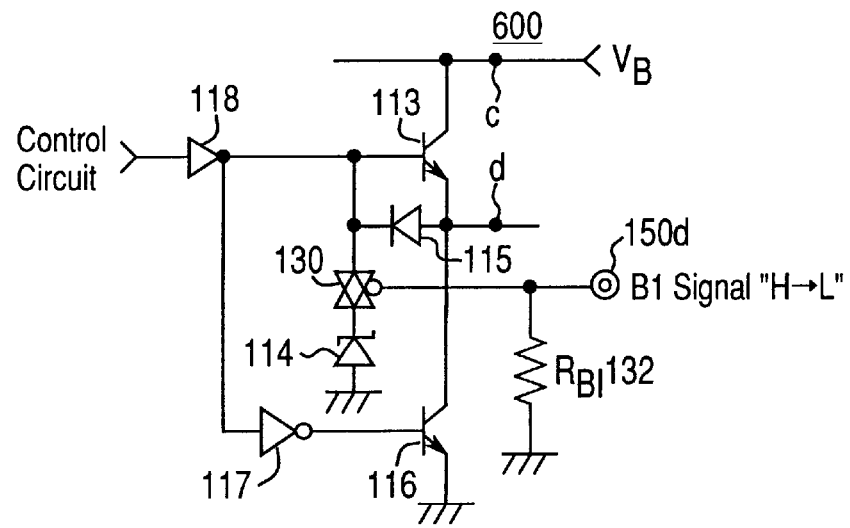
Fig.7

HYBRID IC WITH CIRCUIT FOR BURN-IN TEST

BACKGROUND OF THE INVENTION

1. Field of the Invention

The present invention relates to a burn-in test for hybrid ICs equipped with semiconductor power elements such as power MOSFETs or the like mounted by bare chip mounting.

2. Description of the Prior Art

Conventionally, a hybrid IC is well known which has both a semiconductor power element such as a power MOSFET or the like and a control circuit for controlling the semiconductor power element mounted on the same substrate. To the substrate of the hybrid IC is mounted specifically a transfer-molded semiconductor power element or a bare semiconductor power element without being molded (referred to as bare chip mounted semiconductor element hereinafter).

The transfer-molded semiconductor power element can be subjected to a burn-in test before mounted to the substrate of the hybrid IC. On the other hand, in the case of the bare semiconductor power element without molded with a resin or the like, the burn-in test is conducted to the substrate of the hybrid IC after the semiconductor power element is mounted to the substrate.

In general, the control circuit to be mounted to the hybrid IC is often equipped with a protecting Zener diode for preventing a voltage not smaller than rated $V_{GSS}$ from being impressed between a gate and a source of the semiconductor power element. The protecting Zener diode acts not to apply a Zener voltage $V_Z$ or higher voltage ($V_Z<V_{GSS}$ is satisfied) to between the gate and source of the semiconductor power element. Therefore, the burn-in test of impressing a voltage exceeding the Zener voltage $V_Z$ to between the gate and source of the bare chip mounted semiconductor power element is practically impossible.

When the rated voltage $V_{GSS}$ of the semiconductor power element is higher than a rated voltage $V_{CC}$ of the control circuit, a voltage between the gate and source is required to be set so that the control circuit receives a voltage not higher than the rated voltage $V_{CC}$.

SUMMARY OF THE INVENTION

An object of the present invention is to provide a hybrid IC enabling a burn-in test for a semiconductor power element without being restricted by a rated voltage $V_{CC}$ of a control circuit or a Zener voltage $V_Z$ of a Zener diode arranged for the protection of the semiconductor power element.

In order to accomplish the above object, a hybrid IC provided according to the present invention is constituted of a semiconductor power element and a control circuit for the semiconductor power element, in which a burn-in test circuit setting a predetermined potential difference between a gate and a source of the semiconductor power element and controlling a voltage to be supplied to the control circuit to be not larger than a regulated value is formed with the use of a removable wiring. For the removable wiring, a low resistance element removable after the burn-in test or a wiring having a pattern that can be opened or shortcircuited after the burn-in test may be employed.

In the hybrid IC of the present invention, because of the above burn-in test circuit utilizing the removable wiring, the burn-in test is carried out properly without being restricted by a rated voltage $V_{CC}$ of the control circuit or a Zener voltage $V_Z$ of a Zener diode provided for protecting the semiconductor power element. Since the burn-in test circuit is removable after the burn-in test, the hybrid IC is completed easily as a product.

When the low resistance element removable after the burn-in test, or wiring having the pattern that can be opened or shortcircuited after the burn-in test is used for the removable wiring, the wiring can be removed easily after the burn-in test. The burn-in test circuit is constituted more appropriately.

According to a different embodiment of the present invention, a switch is set in the hybrid IC which shuts the supply of voltage to a predetermined element of the control circuit. The switch enables an appropriate burn-in test without being restricted by the rated voltage $V_{CC}$ of the control circuit or Zener voltage $V_Z$ of the Zener diode installed for protecting the semiconductor power element. The hybrid IC as a product is completed simply by changing over the switch after the burn-in test.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 5A is a diagram showing a constitution of a solder part;

FIG. 5B is a diagram of a state of the solder part of FIG. 5A after soldered;

FIG. 6 is a circuit diagram of a hybrid IC according to an embodiment 4 of the present invention; and FIG. 7 is a circuit diagram of a hybrid IC according to an embodiment 5 of the present invention.

DETAILED DESCRIPTION OF THE EMBODIMENTS

(1) Outline of the Invention

In addition to a wiring designed to complete a hybrid IC as a product, the hybrid IC of the present invention has a wiring for a burn-in test. The burn-in test wiring is set in a state to be easily removed after the burn-in test is executed to the hybrid IC before the hybrid IC is completed as a product. Upon necessities, such a wiring may be used that keeps a circuit open during the burn-in test and shortcircuits the circuit after the burn-in test. The burn-in test at a voltage exceeding a rated voltage $V_{GSS}$ between a gate and a source of a semiconductor power element is realized without being restricted by a rated voltage $V_{CC}$ of a control circuit or a Zener voltage $V_Z$ of a Zener diode arranged for protecting the semiconductor power element.

The hybrid IC of the present invention will be schematically depicted prior to the description of embodiments 1–5 thereof featuring the above aspect.

Figure 1:
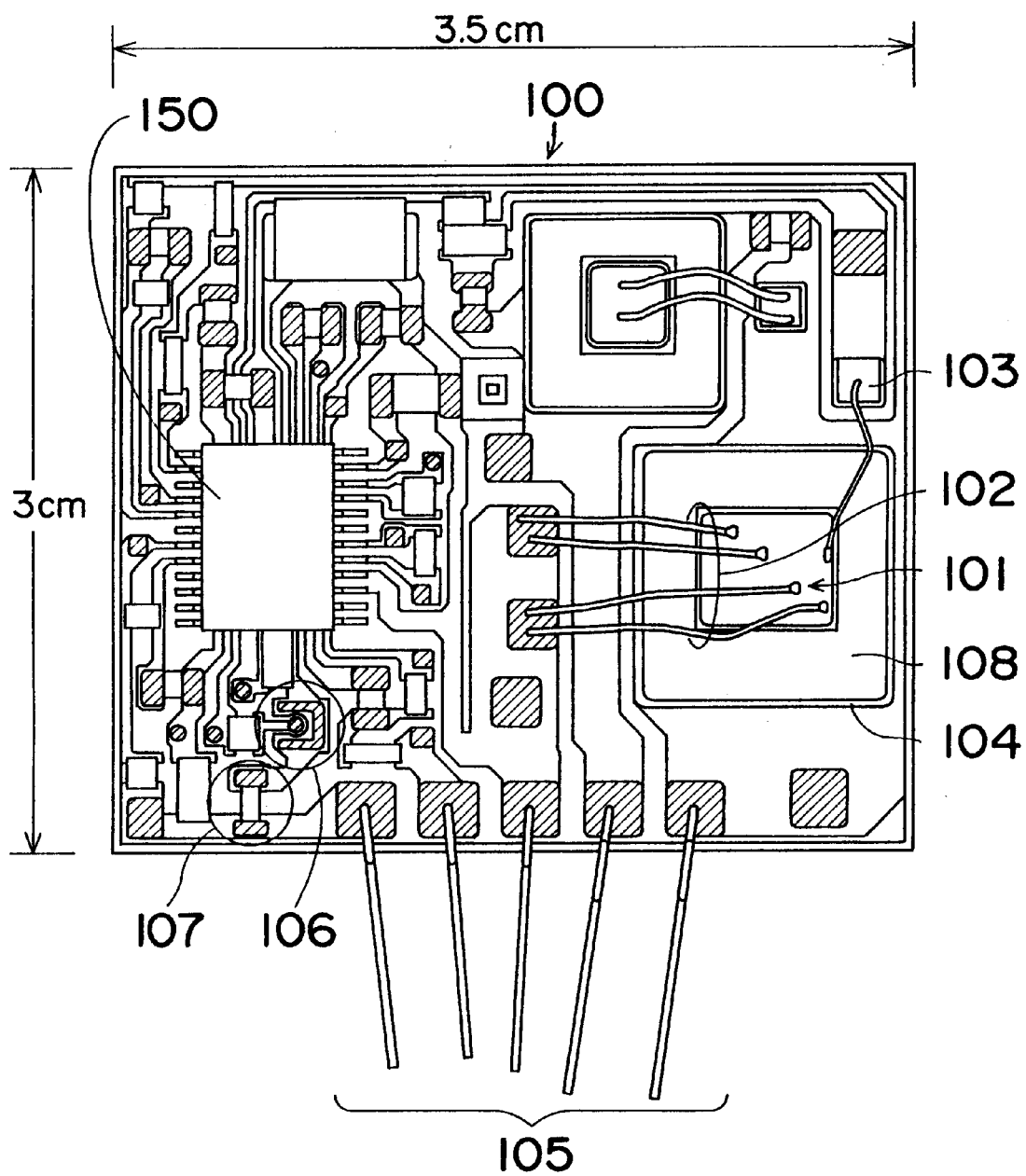
FIG. 1 is a front view of a hybrid IC.

FIG. 1 is a front view of a hybrid IC 100 in one embodiment of the present invention. The hybrid IC 100 is constituted of a power MOSFET 101 of a rated voltage $V_{GSS}$ and a control circuit 150 of a rated voltage $V_{CC}$ mounted on the same substrate. The power MOSFET 101 is bare chip mounted. As shown in FIG. 1, the power MOSFET 101 is loaded on a radiation panel 108, and a source 102 and a gate 103 are connected to a surface of the substrate by aluminum wire bonding. A drain 104 is formed at a rear face of the chip. The control circuit 150 is provided with a Zener diode of a Zener voltage $V_Z$ (holding a relation of $V_Z<V_{GSS}$). The Zener diode controls to prevent a voltage not smaller than the Zener voltage $V_Z$ from being impressed between the gate and source of the power MOSFET 101. The hybrid IC is approximately 3 cm long and 3.5 cm wide.

The hybrid IC includes parts such as a solder part 106 to be soldered, etc. where the circuit is opened during a burn-in test and shortcircuited by soldering after the burn-in test, and a laser cut part 107, etc. where the circuit is shortcircuited during the burn-in test and opened through cutting or elimination of the part by means of a laser after the burn-in test. A plurality of solder parts 106 and laser cut parts 107 may be formed in the hybrid IC.

In the hybrid IC 100, a burn-in test circuit is formed which impresses a predetermined voltage (for instance, rated voltage $V_{GSS}$) between the gate and source of the power MOSFET 101, and at the same time sets a voltage to be impressed to the Zener diode at a value not larger than the Zener voltage $V_Z$ with the use of the above solder part 106 and laser cut part 107. Because of the burn-in test circuit, the burn-in test at a voltage exceeding the rated voltage $V_{GSS}$ between the gate and source of the semiconductor power element is enabled without restrictions by the Zener voltage $V_Z$ of the protecting Zener diode.

Similarly, a burn-in test circuit is formed which, with utilizing the solder part 106 and laser cut part 107, makes a voltage to be applied to the control circuit 150 lower than the rated voltage $V_{CC}$ if the rated voltage $V_{CC}$ of the control circuit 150 is not larger than the rated voltage $V_{GSS}$ of the power MOSFET 101. The burn-in test can accordingly be carried out at a voltage over the rated voltage $V_{GSS}$ between the gate and source of the semiconductor power element without being limited by the rated voltage $V_{CC}$ of the control circuit.

After the burn-in test, the solder part 106 is soldered thereby to connect the wiring, and the laser cut part 107 is cut thereby to disconnect the wiring, whereby the hybrid IC is completed as a product. The completed hybrid IC except external pins 105 is packaged.

(2) Embodiment 1

Figure 2:
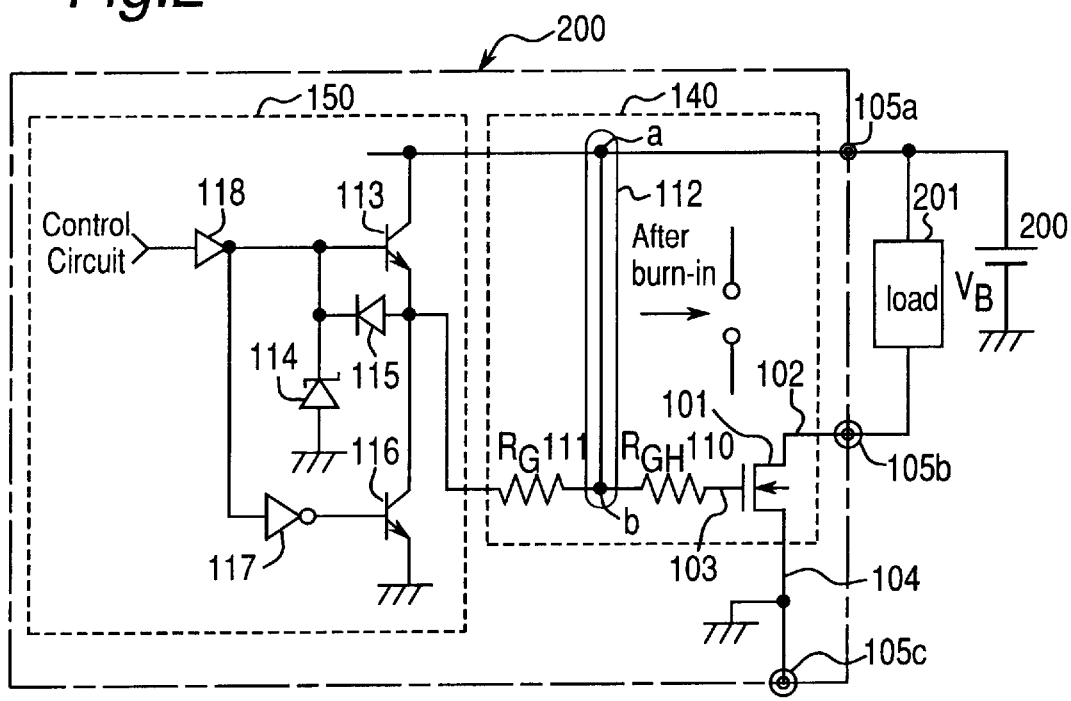
FIG. 2 is a circuit diagram of a hybrid IC according to an embodiment 1 of the present invention.

FIG. 2 is a circuit diagram of a hybrid IC 200 according to an embodiment 1 of the present invention. The same parts as in the hybrid IC 100 are designated by the same reference numerals, and a duplicate description is omitted here. The hybrid IC 200 features a wiring 112. The wiring 112 shortcircuits the circuit so that a voltage exceeding the Zener voltage $V_Z$ is not applied during the burn-in test to a Zener diode 114 constituting a protecting circuit for the semiconductor power element and incorporated in the control circuit 150. The wiring 112 connects a point a on the wiring connected to an external pin 105a and a point b between a resistor $R_G$ 111 and a resistor $R_{GH}$ 110 thereby to shortcircuit the circuit, as enclosed by a thin line.

A source voltage $V_B$ is fed to the external pin 105a of the hybrid IC 200 from a power source 200. An external pin 105b connected to the source 102 of the power MOSFET 101 receives the source voltage $V_B$ via a load 201. An external pin 105c is used as a source-grounding terminal for the power MOSFET 101.

The protecting circuit consisting of transistors 113, 116, the Zener diode 114, a diode 115, an inverter 117 and a buffer 118 is set inside the control circuit 150.

In the absence of the wiring 112, when the buffer 118 shows an "H" potential, the transistor 113 is turned ON and transistor 116 is turned OFF. As a result, an emitter voltage of the transistor 113 is output as an output of the control circuit 150. If the potential of the buffer 118 is lower than the Zener voltage $V_Z$ in this case, a voltage obtained by subtracting a voltage $V_{BE}$ between a base and an emitter of the transistor 113 from the potential of the buffer 118 is impressed to the gate of the power MOSFET 101.

On the other hand, if the potential of the buffer 118 is higher than the Zener voltage $V_Z$, the potential of the buffer 118 is clamped by the Zener diode 114, and consequently a voltage obtained by subtracting the base-emitter voltage $V_{BE}$ of the transistor 113 from the Zener voltage $V_Z$ is applied to the gate of the power MOSFET 101 irrespective of the potential of the buffer 118.

The protecting circuit thus prevents a voltage exceeding the Zener voltage $V_Z$ from being impressed between the gate and source of the power MOSFET 101. In other words, the Zener voltage $V_Z$ or higher voltage could not be fed to the gate of the power MOSFET 101 without the wiring 112.

Meanwhile, in the presence of the wiring 112, the source voltage $V_B$ fed to the external pin 105a is input to the Zener diode 114 via the resistor $R_G$ 111 and diode 115. In the case where the rated voltage $V_{GSS}$ between the gate and source of the power MOSFET 101 is ±20 V and the Zener voltage $V_Z$ is approximately 18 V, the resistor $R_G$ 111 is set, e.g., at about 200Ω. The resistor $R_{GH}$ 110 is set to be a relatively small value as compared with the resistor $R_G$ 111. The source voltage $V_B$ input through the external pin 105a is mostly impressed to the gate of the power MOSFET 101 owing to the above constitution including the wiring 112.

In the thus-constituted arrangement, a current $I_{ZD}$ running in the Zener diode 114 is expressed by a formula ($V_B$–(voltage drop at the diode 115)–(voltage drop by the Zener diode 114))/$R_G$ 111. When a thermal resistance of the control circuit 150 which is an IC incorporating the Zener diode 114 is approximately 100°/W, a power loss Pw at the Zener diode 114 is as small as about 32 mA×18 V=0.58 W even if the source voltage $V_B$=25 V is supplied from the external pin 105a, resulting in a temperature rise at the control circuit 150 of 100×0.58=58° C. A general resin-molded IC has a heat resistance of 150° C., and therefore the Zener diode 114 is never broken on condition that a surrounding temperature is 92° C. or lower.

As is understood from the above description, the presence of the wiring 112 enables such burn-in test that applies a voltage exceeding the Zener voltage $V_Z$ and rated voltage $V_{GSS}$, e.g., 25 V between the source and gate of the power MOSFET 101.

The circuit is opened by cutting the wiring 112 by means of a laser or the like after the burn-in test is finished. The hybrid IC board 200 is thus completed.

(3) Embodiment 2

Figure 3:
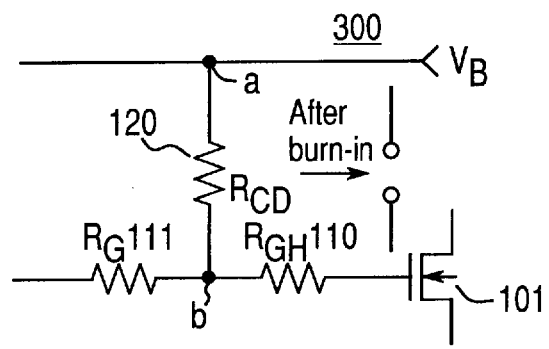
FIG. 3 is a circuit diagram of a hybrid IC according to an embodiment 2 of the present invention.

FIG. 3 is a circuit diagram showing a constitution of a fundamental portion of a hybrid IC 300 according to an embodiment 2, that is, portion enclosed by a dotted line 140 of the hybrid IC 200 of the embodiment 1 in FIG. 2. A circuit constitution except the portion enclosed by the dotted line 140 is the same as in the hybrid IC 200.

The hybrid IC 300 uses a thick film resistor substrate as a base. The point a on the wiring receiving the source voltage $V_B$ and the point b between the resistors $R_G$ 111 and $R_{GH}$ 110 are shortcircuited from each other with the use of a thick film printed resistor $R_{CD}$ 120.

In the event the hybrid IC 300 employs a substrate that cannot use a printed resistor, e.g., metallic substrate or the like, a trimmable chip resistor is utilizable as the resistor $R_{CD}$ 120.

In the constitution as above, a voltage to be applied to the semiconductor power element 101 becomes a divided voltage between the resistors $R_{CD}$ 120 and $R_G$ 111. Therefore, the resistor $R_{CD}$ 120 is required to be set at a sufficiently smaller resistance value than the resistor $R_G$ 111. For example, when the resistor $R_G$ 111 is 200Ω, the resistor $R_{CD}$ 120 is preferably set at nearly several-several tens Ω.

The same operation and effect as discussed with reference to the hybrid IC 200 in the embodiment 1 are achieved by shortcircuiting the points a and b with the use of the resistor $R_{CD}$ 120 and opening the circuit through removal of the resistor $R_{CD}$ 120 or cutting of the same resistor by the laser.

In comparison with the case where the circuit is shortcircuited with the simple use of the wiring 112, the circuit can be opened furthermore easily by laser beams after the burn-in test if the circuit is shortcircuited with the use of the resistor $R_{CD}$ 120 as in the hybrid IC 300 of the embodiment 2.

(4) Embodiment 3

Figure 4:
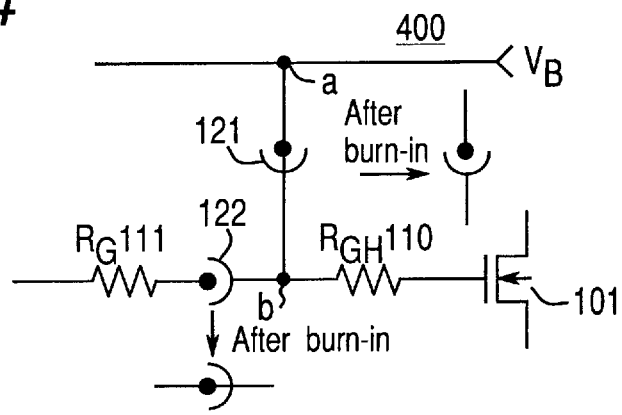
FIG. 4 is a circuit diagram of a hybrid IC according to an embodiment 3 of the present invention.

FIG. 4 shows a constitution of a fundamental portion of a hybrid IC 400 according to an embodiment 3. A circuit diagram of FIG. 4 represents a portion enclosed by the dotted line 140 of the hybrid IC 200 of the embodiment 1 in FIG. 2. A circuit constitution of the hybrid IC 400 is equal to that of the hybrid IC 200 except the above portion enclosed by the dotted line 140.

In each of the hybrid ICs 200 and 300 of the embodiments 1 and 2, a dynamic resistance of the Zener diode 114 is reduced to lessen a thermal resistance when the resistor $R_G$ 111 has a small resistance, which necessitates the Zener diode 114 to be large in size. On the occasion of the burn-in test in the hybrid IC 400, the point a on the wiring to which the source voltage $V_B$ is applied and the point b between the resistors $R_G$ 111 and $R_{GH}$ 110 are shortcircuited, and moreover a wiring extending from the point b to the control circuit 150 via the resistor $R_G$ 111 is opened.

Solder parts 121 and 122 of the same shape as the solder part 106 in FIG. 1 are formed on the substrate of the hybrid IC 400. At the burn-in test, the solder part 121 is soldered, thereby to apply the source voltage $V_B$ sent from the external pin 105a directly to the gate of the semiconductor power element 101. The solder part 122 is opened to prevent a voltage from being impressed to the control circuit 150 via the resistor $R_G$ 111.

FIGS. 5A and 5B show a constitution of the solder part 122. As indicated in FIG. 5A, a wiring pattern enclosing one connection terminal schematically in a U shape is adopted for the solder part 122. Therefore, at the solder part 122, the wiring can be correctly connected simply by attaching a solder 125 to one point as illustrated in FIG. 5B. Moreover, only a small amount of the solder is used to connect the wiring, so that the solder can be sucked (removed) easily.

The solder part 121, and a solder part 123 to be employed in an embodiment 4 described later are constituted in the same fashion as the solder part 122.

After the completion of the burn-in test, the solder of the solder part 121 is sucked thereby to cut the wiring, and the solder part 122 is soldered thereby to connect the wiring. In consequence, the hybrid IC 400 is completed as a product.

(5) Embodiment 4

A constitution of a hybrid IC 500 according to an embodiment 4 is shown in FIG. 6. The solder part 123 referred to hereinabove is added to the hybrid IC 400 of the embodiment 3, thereby to constitute the hybrid IC 500.

When the burn-in test is performed, the solder part 121 is soldered, while the solder parts 122, 123 are not soldered. Accordingly, the control circuit 150 is perfectly separated from the semiconductor power element 101 at the time of the burn-in test. The burn-in test can be conducted properly without regard to the rated voltage $V_{CC}$ of the control circuit 150 and Zener voltage $V_Z$.

After the burn-in test, the solder of the solder part 121 is sucked to cut the wiring, and the solder parts 122, 123 are soldered thereby to connect the wiring. The hybrid IC 500 is obtained in this manner.

(6) Embodiment 5

FIG. 7 is a diagram of a constitution of an essential portion of a hybrid IC 600 according to an embodiment 5 of the present invention. More specifically, the circuit diagram shows a portion enclosed by a dotted line 150 in the hybrid IC 200 of the embodiment 1 in FIG. 2, namely, control circuit 150. A constitution of the portion enclosed by the dotted line 150 excluding the control circuit 150 is made the same as that of the hybrid IC 200 of the embodiment 1 without the wiring 112.

The hybrid IC 600 is provided with a switch 130 at a voltage input part of the Zener diode 114 so as to prevent a voltage not smaller than the Zener voltage $V_Z$ from being applied to the Zener diode 114 at the time of a burn-in test. The switch 130 connects the circuit when an "L" BI signal is input and disconnects the circuit when an "H" BI signal is input. Since the "H" BI signal is fed to shut the switch 130 at the burn-in test, a circuit element to be protected (Zener diode 114) is surely protected.

In order to prevent that a voltage not smaller than the rated voltage $V_{CC}$ is sent to the control circuit 150 at the burn-in test, the same switch as the switch 130 may be arranged at points c and d. In the arrangement, the whole of the control circuit 150 can be protected when the power MOSFET 101 is subjected to the burn-in test.

Because of the employment of the switch 130 in the hybrid IC 600, the burn-in test can be carried out properly without using a solder.

The switch 130 of an opposite characteristic may be used instead.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A hybrid IC comprising:

a semiconductor power device connected to a load, and configured to supply power to the load from a power source;

a control circuit configured to control said semiconductor power device by controlling a potential applied to a gate of said semiconductor power device, comprising a protection circuit configured to limit the gate potential to a predetermined threshold value; and a burn-in test circuit comprising first wiring configured to by-pass said control circuit in order to apply a potential higher than the predetermined threshold value of the control circuit to the gate of said semiconductor power device during burn-in testing and to be open circuited after said burn-in testing.

2. The hybrid IC as claimed in claim 1, wherein said first wiring connects a power source line and the gate of said semiconductor power device during a burn-in test.

3. The hybrid IC as claimed in claim 2, wherein said first wiring includes a low resistance element.

4. The hybrid IC as claimed in claim 2, wherein said burn-in circuit further comprises a second wiring configured to open circuit the power source line from said control circuit during burn-in testing and to be short circuited after a burn-in test.

5. The hybrid IC as claimed in claim 2, wherein said burn-in circuit further comprises a second wiring configured to open circuit the gate of said semiconductor power source from said control circuit during burn-in testing and to be short circuited in order to connect the gate of said semiconductor device to said control circuit after a burn-in test.

6. A hybrid IC comprising:

a semiconductor power device connected to a load, and configured to supply power to the load from a power source;

a control circuit configured to control said semiconductor power device by controlling a potential applied to a gate of said semiconductor power device, comprising a protection circuit configured to limit the gate potential to a predetermined threshold value; and a burn-in test circuit configured to by-pass said control circuit in order to apply a potential higher than the predetermined threshold value of the control circuit to the gate of said semiconductor power device during burn-in testing, and to be disconnected after said burn-in testing.

* * * * *